United States Patent
John et al.

(10) Patent No.: US 8,084,786 B2
(45) Date of Patent: Dec. 27, 2011

(54) SILICIDED BASE STRUCTURE FOR HIGH FREQUENCY TRANSISTORS

(75) Inventors: Jay P. John, Chandler, AZ (US); James A. Kirchgessner, Tempe, AZ (US); Vishal P. Trivedi, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 1 day.

(21) Appl. No.: 12/846,385

(22) Filed: Jul. 29, 2010

(65) Prior Publication Data

US 2010/0314664 A1 Dec. 16, 2010

Related U.S. Application Data

(62) Division of application No. 12/147,236, filed on Jun. 26, 2008, now Pat. No. 7,803,685.

(51) Int. Cl.
 *H01L 29/737* (2006.01)
(52) U.S. Cl. ........ 257/197; 257/166; 257/198; 257/587; 257/E29.188
(58) Field of Classification Search .......... 257/163–166, 257/197, 205, 273, 351, 361, 378, 423, 427, 257/474, 477, 517, 526, 539, 544, 565–593, 257/928, E51.004, E31.069, E27.017, E27.019–E27.023, 257/E27.037–E27.043, E27.053–E27.058, 257/E27.074–E27.078, E27.106, E27.149, 257/E29.03–E29.035, E29.044–E29.045, 257/E29.114, E29.124, E29.171–E29.202; 438/581, 583, 630, 651, 682
See application file for complete search history.

(56) References Cited

U.S. PATENT DOCUMENTS

| 7,691,716 | B2 * | 4/2010 | Ho et al. | 438/309 |
|---|---|---|---|---|
| 2005/0054172 | A1 * | 3/2005 | Feng et al. | 438/313 |
| 2005/0079726 | A1 * | 4/2005 | Chen et al. | 438/723 |
| 2005/0218399 | A1 * | 10/2005 | Magnee et al. | 257/19 |
| 2005/0236645 | A1 | 10/2005 | Khater et al. | |
| 2006/0081934 | A1 * | 4/2006 | Khater et al. | 257/360 |
| 2007/0126080 | A1 * | 6/2007 | Wallner et al. | 257/565 |
| 2007/0278539 | A1 * | 12/2007 | Dyson et al. | 257/256 |
| 2010/0001319 | A1 * | 1/2010 | Pelouard et al. | 257/197 |
| 2010/0078623 | A1 * | 4/2010 | Feng et al. | 257/13 |

OTHER PUBLICATIONS

Washio, K., et al., Self-Aligned Metal/IDP Si Bipolar Technology wotj 12-ps PCL amd 45-GHz Dynamc Frequency Divider, IEEE Transactions on Electron Devices, vol. 44, No. 11, Nov. 1997 pp. 2078-2082.

Nai, T., et al., 12-ps ECL Using Low-Base-Resistance Si Bipolar Transistor by Self-Aligned Metal/IDP Technology, IEEE Transactions on Electron Devices, vol. 44, No. 12, Dec. 1997 pp. 2207-2212.

* cited by examiner

*Primary Examiner* — N Drew Richards
*Assistant Examiner* — Mamadou Diallo
(74) *Attorney, Agent, or Firm* — Ingrassia Fisher & Lorenz PC

(57) ABSTRACT

High frequency performance of (e.g., silicon) bipolar devices is improved by reducing the extrinsic base resistance Rbx. Emitter, base and collector regions are formed in or on a semiconductor substrate. The emitter contact has a portion that overhangs a portion of the extrinsic base contact, thereby forming a cave-like cavity between the overhanging portion of the emitter contact and the underlying regions of the extrinsic base contact. When the emitter contact and the extrinsic base contact are silicided, some of the metal atoms forming the silicide penetrate into the cavity so that the highly conductive silicided extrinsic base contact extends under the edge of the emitter contact closer to the base itself, thereby reducing Rbx. Smaller Rbx provides transistors with higher $f_{MAX}$.

20 Claims, 9 Drawing Sheets

SILICIDED BASE STRUCTURE FOR HIGH FREQUENCY TRANSISTORS

CROSS-REFERENCE TO RELATED APPLICATION

This application is a divisional of co-pending U.S. patent application Ser. No. 12/147,236.

TECHNICAL FIELD

Embodiments of the invention relate generally to semiconductor devices, and more particularly to methods and structures for forming bipolar transistors.

BACKGROUND

For ultra-high frequency operation, e.g., in the 77 GHz auto radar band and above, transistors with very high $f_{MAX}$ (>250 GHz) and low high frequency noise are needed. Higher frequency bands, e.g., the 94+GHz imaging band, will require even higher performance devices. While semiconductor devices employing III-V compounds are useful in these very high frequency bands, such devices are generally more expensive than is desired. A silicon based solution is desirable for ease of integration with other complex electronic functions and for low cost manufacturing. Self-aligned emitter-base silicon-germanium hetero junction bipolar transistors (HBTs) are potential candidates for such very high frequency devices, provided that the current device performance limitations can be overcome. For example, the extrinsic base resistance Rbx is currently larger than desired and detracts from the overall device performance. Accordingly, a need continues to exist for structures and methods of manufacture of bipolar transistors that avoid or mitigate these and other limitations of the current art.

BRIEF DESCRIPTION OF THE DRAWINGS

Embodiments of the invention will be better understood from a reading of the following detailed description, taken in conjunction with the accompanying figures in the drawings in which like numerals denote like or analogous elements, and wherein.

DETAILED DESCRIPTION

Figure 1:
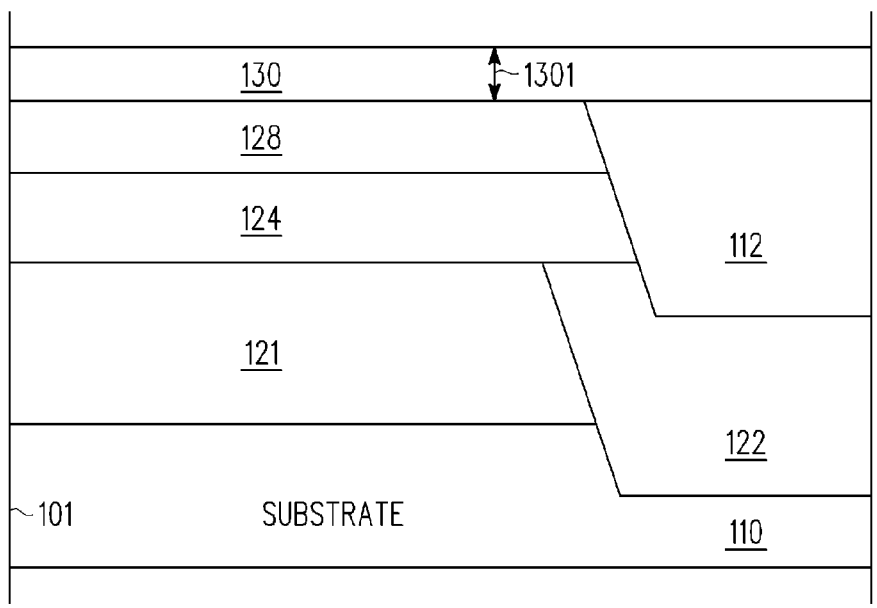
FIGS. 1-9 and 11-12 show simplified schematic cross-sectional views of a portion of a semiconductor device at various stages of manufacture according to an embodiment of the present invention.

The following detailed description is merely exemplary in nature and is not intended to limit the embodiments of the invention or the application and uses of the embodiments. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the description of the invention embodiments. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences, orientations and arrangements other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as used herein, is defined as directly or indirectly connected in an electrical or non-electrical manner.

Figure 9:
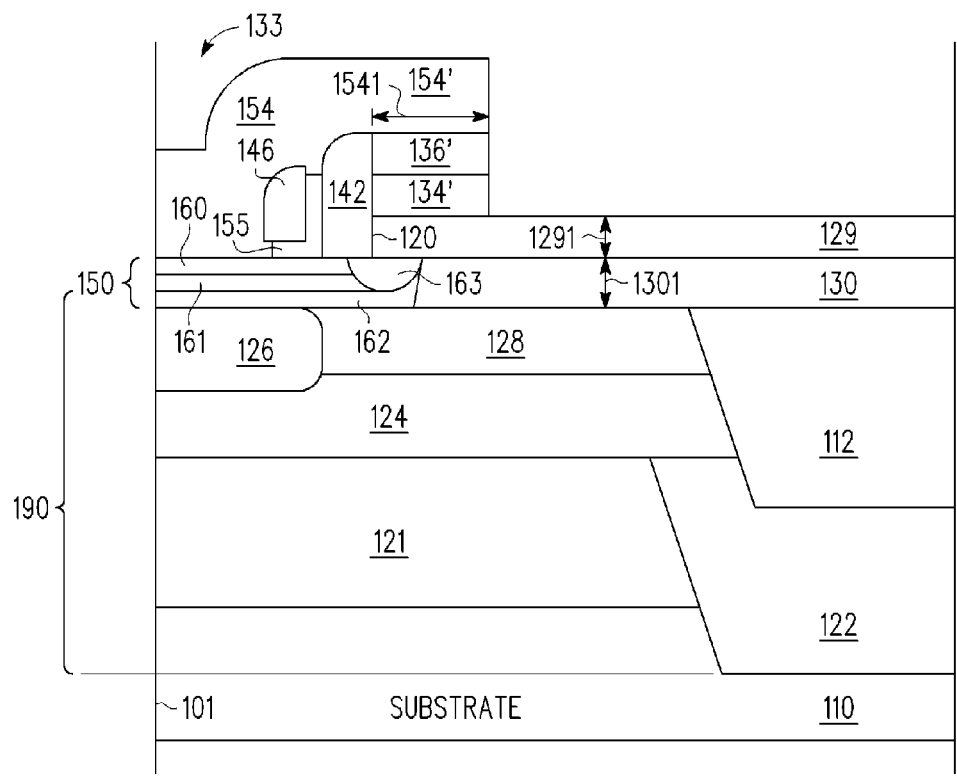
Figure 10:
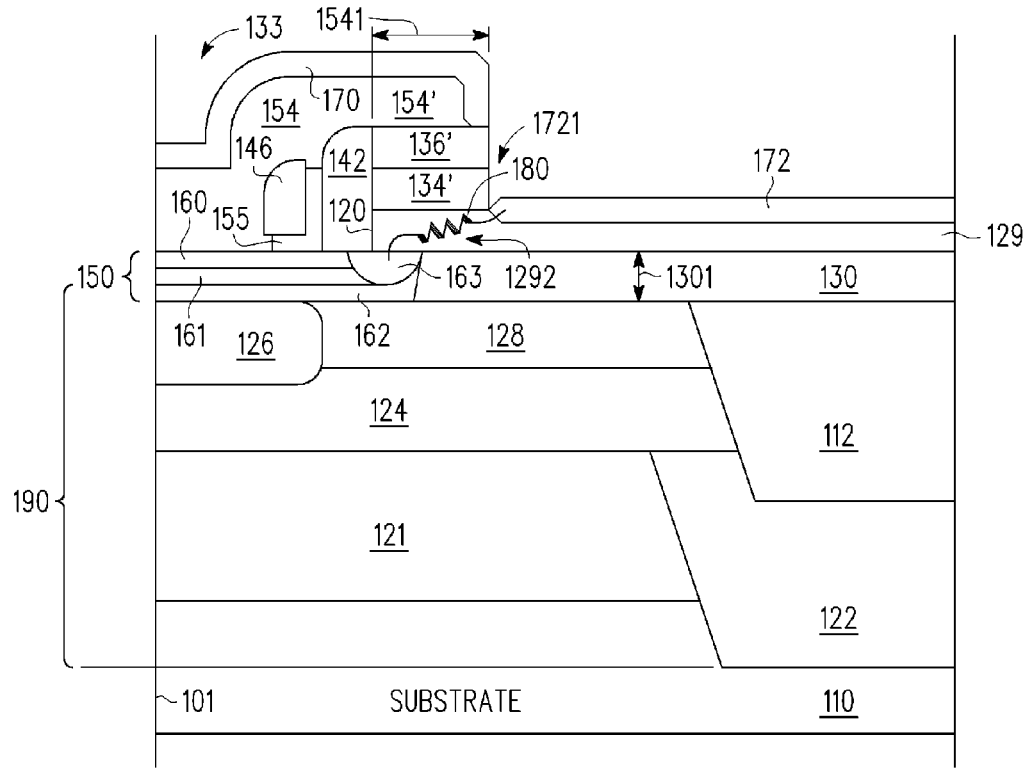
FIG. 10 shows a simplified schematic cross-sectional views of a portion of a semiconductor device subsequent to those of FIGS. 1-9 illustrating how higher than desired extrinsic base resistance can arise.

FIGS. 1-9 and 11-12 show simplified schematic cross-sectional views of a portion of semiconductor device 100 at various manufacturing stages 201-209 and 211-212, according to embodiments of the present invention and FIG. 10 show a simplified schematic cross-sectional view of a portion of semiconductor device 100' at manufacturing stage 210 following stages 201-209 of FIGS. 1-9 illustrating how undesirable extrinsic base resistance can arise. It should be understood that semiconductor device 100 is merely exemplary and that embodiments of the present invention may be manufactured using many different methods not specifically depicted or otherwise disclosed herein. Device 100 is generally symmetrical about cut line 101.

Referring now to initial manufacturing stage 201 of FIG. 1, the portion of device 100 can include semiconductor substrate 110. In one embodiment, substrate 110 can comprise a p-type bulk silicon wafer or an n-type bulk silicon wafer. In a different embodiment, substrate 110 can comprise a different semiconductor material such as silicon-germanium, germanium, gallium arsenide, other III-V compounds, II-VI compounds, other semiconducting materials both inorganic and organic, and combinations thereof. In another embodiment, substrate 110 can be a semiconductor-on-insulator (SOI) wafer having, for example, a first semiconductor layer, a second semiconductor layer, and an electrical insulator layer located between the first and second semiconductor layers. As used herein, the terms "substrate" and "substrate 110" are intended to include all such variations and combinations.

In one embodiment, by way of example for forming an npn device and not intended to be limiting, substrate 110 is a p-type substrate and includes a heavily doped n-type region 122, a heavily doped n-type region 121, a less-heavily doped n-type region 124, and a moderately-doped n-type region 128. Regions 121, 122, 124, 128 along with region 126 which may be added later in the manufacturing process (e.g., see FIG. 5-6), will eventually form part of collector region 190

(see FIG. 6) of a bipolar transistor. The methods of forming regions 121, 122, 124, and 128 are well-known in the art and will not be further described herein. Isolation region 112, preferably of a dielectric material, is formed over a portion of region 122 and can be provided before forming regions 121, 122, 124, and layer 128, during their formation or after their formation. By way of example and not intended to be limiting, region 112 can be formed using a shallow trench isolation (STI) method and by a local oxidation of silicon (LOCOS) method and by other methods well known in the art. After the formation of isolation region 112 and regions 121, 122, 124, and 128, dielectric layer 130 of thickness 1301 is formed over layer 128 and isolation region 112. Layer 130 is desirably an electrical insulating layer and can be formed by any number of well known techniques. Non-limiting examples are: growing a thermal oxide and depositing an insulating material such as an oxide, a nitride, an oxy-nitride or other dielectric materials, by chemical vapor deposition (CVD). Other deposition methods may also be used, as for example and not intended to be limiting, depositing an oxide formed using TEOS (tetra-ethyl-ortho-silicate) or other reactants. Sputtering or evaporation of oxides, nitrides, oxy-nitrides and/or other dielectric material may also be used. Growing and/or depositing a combination of insulating materials comprising one or more of any of the previously listed dielectric materials and other dielectric materials, using any of these preparation techniques may be used. Silicon oxide and silicon nitride are non-limiting examples of materials useful for dielectric layer 130. Silicon oxide is preferred. Thickness 1301 is usefully in the range of about 30 to 120 nanometers, more conveniently about 40 to 90 nanometers and preferably about 75 nanometers but thicker or thinner layers can also be used depending upon the desired device properties. Structure 301 results.

Figure 2:
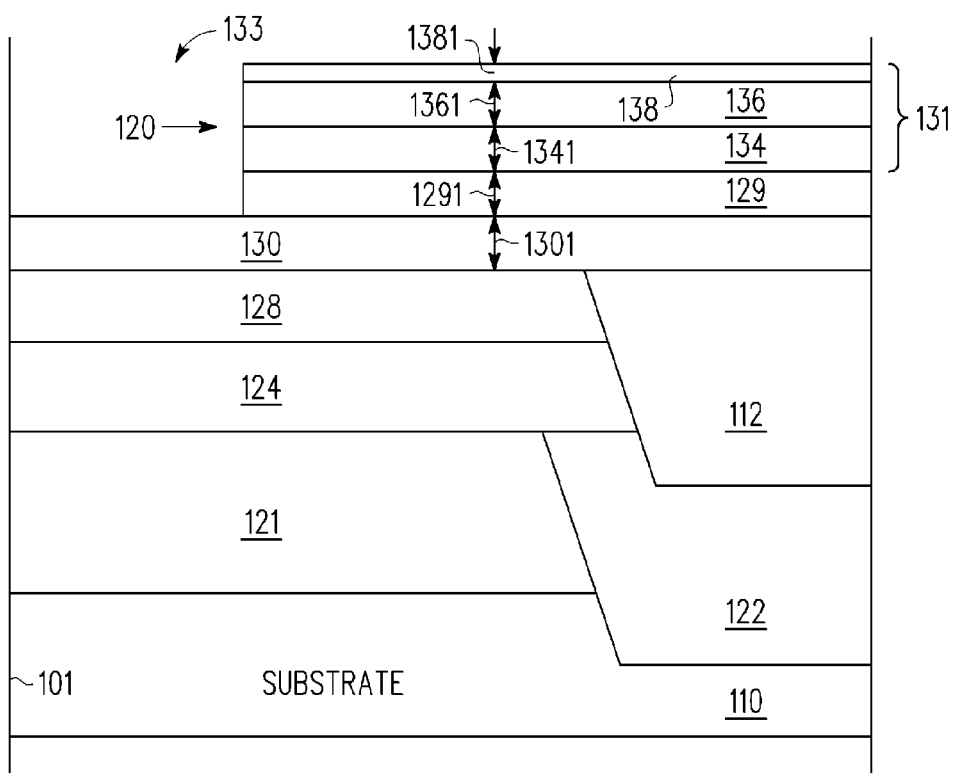

Referring now to manufacturing stage 202 of FIG. 2, base electrode layer 129 of thickness 1291 is formed over layer 130. As an example and not intended to be limiting, layer 129 can be formed by depositing a layer of polysilicon over layer 130. Thickness 1291 is usefully in the range of about 20 to 200 nanometers, more conveniently about 50 to 150 nanometers and preferably about 120 nanometers, but thicker or thinner layers can also be used depending upon the desired device properties. In one embodiment, layer 129 can be deposited by a LPCVD (low-pressure chemical vapor deposition) method. Where an NPN transistor is being fabricated, layer 129 can be heavily p-type doped in-situ, by ion implantation, or by thermal diffusion or other means. In-situ doping, as that term is used herein, includes doping during formation of the layer, for example, using the same chamber or the same tool. If a PnP device is being fabricated, opposite conductivity (n-type) doping is used. In subsequent manufacturing stages, layer 129 will become the extrinsic base contract of transistor 100, 100' and is therefore from time to time also referred to as extrinsic base contact 129.

Oxide-nitride structure 131 is usefully formed over the layer 129. Structure 131 desirably includes oxide and nitride layers. In one embodiment, structure 131 includes nitride layer 136 of thickness 1361 sandwiched between two oxide layers; oxide layer 134 of thickness 1341 and oxide layer 138 of thickness 1381, to form oxide-nitride-oxide (ONO) structure 131. As an example, silicon nitride layer 136 can be formed between two layers 134, 138 of an oxide formed using TEOS. Thickness 1341 is usefully in the range of about 5 to 100 nanometers, more conveniently about 10 to 30 nanometers and preferably about 15 nanometers, and thickness 1381 is usefully in the range of about 5 to 100 nanometers, more conveniently about 10 to 30 nanometers and preferably about 15 nanometers, but thicker or thinner layers can also be used depending upon the desired device properties. Layer 136 of thickness 1361 can be formed by low-pressure chemical vapor deposition of silicon nitride over layer 134. Thickness 1361 is usefully in the range of about 20 to 150 nanometers, more conveniently about 40 to 100 nanometers and preferably about 70 nanometers, but thicker or thinner layers can also be used depending upon the desired device properties. Layers 138 is conveniently formed by depositing a layer of oxide formed using TEOS over layer 136. In other embodiments, structure 131 can comprise an oxide layer formed over a nitride layer, a nitride layer formed over an oxide layer, two other dielectric layer stacks, an oxide layer sandwiched between two nitride layers, or three or more other dielectric layer stacks. While multi-layer dielectric structures 131 employing various dielectrics materials and not limited merely to oxides and/or nitrides are useful, the above-described ONO structure is preferred.

After depositing structure 131, layer 129 and structure 131 are patterned and etched to facilitate forming an emitter region in location 133 to the left of edge 120. In one embodiment, a masking layer is formed over layer 138, having an opening corresponding to location 133. The masking layer can be a photoresist mask or a hard-etch mask. An etching process then is used to sequentially etch layers 138, 136, 134, and 129. As an example, a first reactive ion etch (RIE) process can be used to etch through a portion of layer 138 to form a first part of emitter location 133. Then, a second RIE etch process can be used to etch through a portion of layer 136 to form a second part of emitter location 133. Then a third RIE etch process, which can be similar to the first RIE etch process, can be used to etch through a portion of layer 134 to form a third part of emitter location 133. Finally, a fourth RIE etch process can be used to etch through a portion of layer 129 to form a fourth part of emitter location 133. The remaining portions of layers 129, 134, 136, 138 to the right of edge 120 underlying the etch mask are undisturbed. Structure 302 results.

Figure 3:
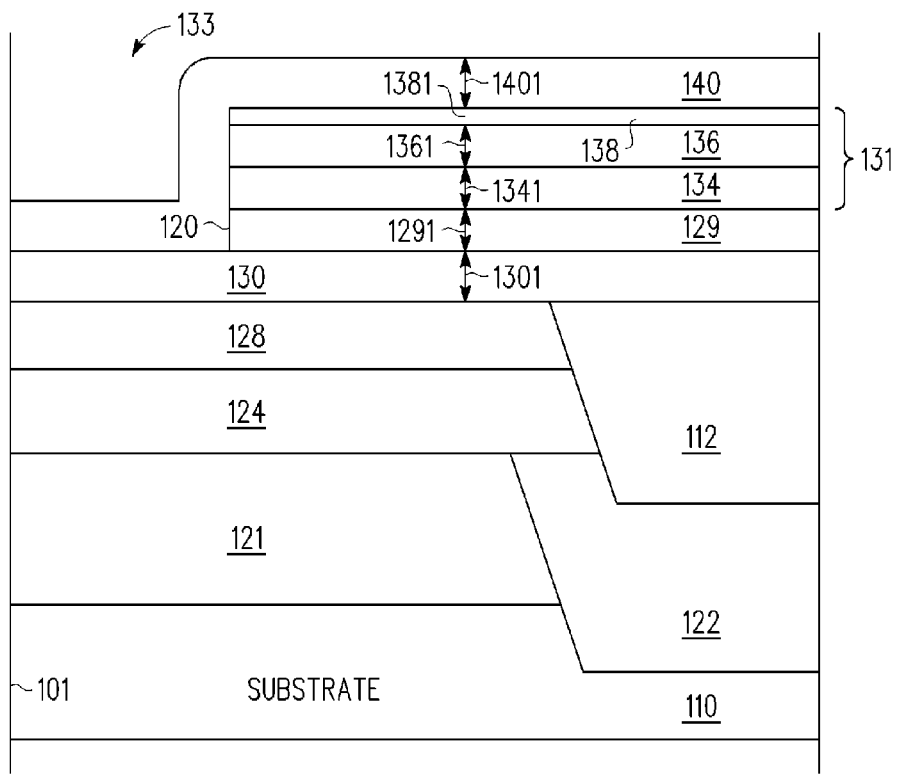

Referring now to manufacturing stage 203 of FIG. 3, insulating layer 140 of thickness 1401 is formed over layers 129 and 130 and structure 131. As a non-limiting example, layer 140 can be formed by LPCVD deposition of silicon nitride. Thickness 1401 is usefully in the range of about 5 to 100 nanometers, more conveniently about 20 to 80 nanometers and preferably about 60 nanometers, but thicker or thinner layers can also be used depending upon the desired device properties. In the same or different embodiments, layer 140 is conveniently composed of the same material as layer 136, as for example, silicon nitride, but this is merely an example of a further embodiment and not intended to be limiting. Structure 303 results.

Figure 4:
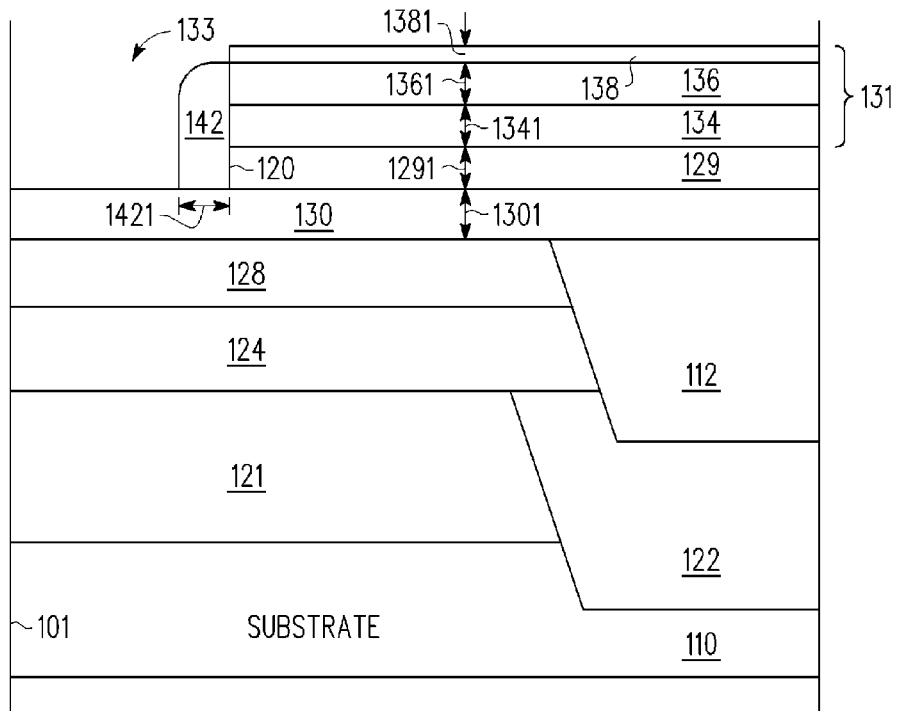

Referring now to manufacturing stage 204 of FIG. 4, spacer 142 is formed in location 133 adjacent to edge (sidewall) 120 of structure 131 and layers 129 by removing a portion of layer 140 formed in manufacturing stage 203 of FIG. 3. Among other things, spacer 142 seals sidewall edge 120 of layer 129 to prevent selective epitaxial growth on sidewall 120 in a later manufacturing step. Width 1421 of spacer 142 corresponds approximately to thickness 1401 and is desirably less than about 200 nanometers and preferably about 60 nanometers, but thicker or thinner layers can also be used depending upon the desired device properties. As a non-limiting example, layer 140 (see FIGS. 3-4) can be anisotropically etched. In one embodiment, layer 140 can be anisotropically etched using a dry etch process, stopping on layers 130 and 138. Use of a mask is usually not required because of the anisotropic nature of the etchant. As an example, a reactive-ion-etch (RIE) process is preferably used to etch layer 140 to form spacer 142. Structure 304 results.

Figure 5:
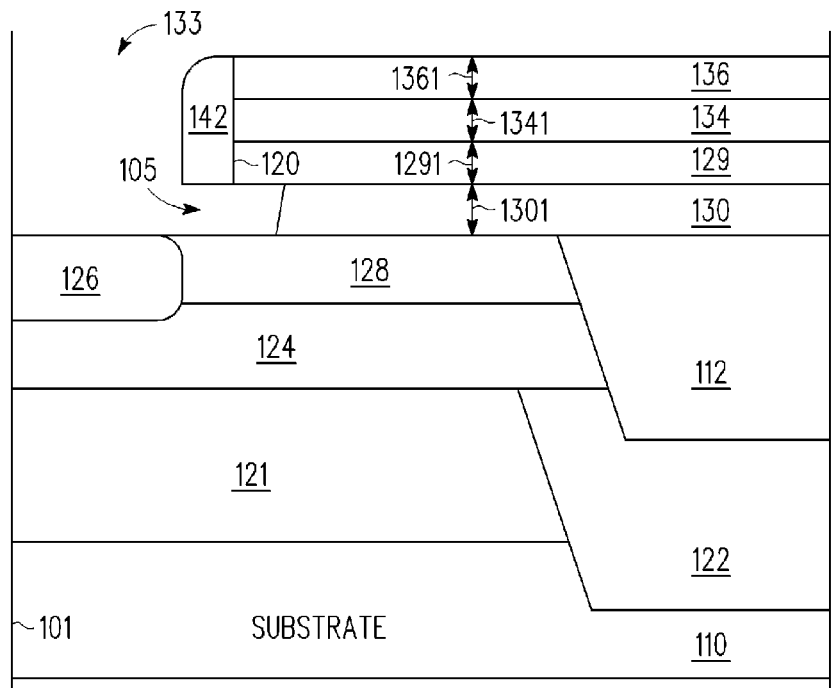

Referring now to manufacturing stage 205 of FIG. 5, layer 138 (see FIG. 4) and a portion of layer 130 are removed. In a preferred embodiment, these are both oxide layers and may be removed at the same time. The portion of layer 130 removed underneath spacer 142 and near left edge 120 of layer 129 forms cavity 105, thereby exposing a portion of region 128 and a portion of the underside of layer 129. As an example, layers 130 and 138 of silicon oxide can be selectively wet etched by a hydrofluoric acid (HF) solution. As used herein, the term "selective etching" or "selectively etched" is intended to refer to reactions in which the materials being removed are etched while other materials that may also be exposed to the etchant(s) are not significantly attacked. Other reagents can be used when layers 130 and 138 are formed of other materials. The selective etching does not attack (e.g. silicon) region 128 and (e.g., poly-silicon) layer 129. In one embodiment, the removal of layer 138 and the portion of layer 130 near edge 120 can occur at the same time. Following the formation of cavity 105, regions 124 and 128 can be optionally locally n-type doped in location 133 to form region 126. As an example, a selectively implanted collector (SIC) implant can be performed in a portion of regions 124 and 128 in location 133 to form region 126. As a further example, region 126 can be self-aligned by spacer 142 and layers 136, 134, 130, and 129. Doping regions 124 and 128 to form region 126 improves $f_T$ of device 100. However, excess dopants too close to the transistor base can undesirably increase the collector-base capacitance of the transistor and hence degrade both $f_T$ and $f_{MAX}$, which are defined respectively as: (i) $f_T$=the frequency where the short-circuit current gain=1, also referred to as the cut-off frequency or transit frequency, an intrinsic speed figure of merit, and (ii) $f_{MAX}$=the frequency where the unilateral power gain=1, also referred to as the maximum frequency of oscillation, a power gain figure of merit. In the same or a different embodiment, before implanting, an additional oxide layer can be deposited in cavity 105 and over layer 136 and region 128 in order to further reduce the collector-base capacitance. An additional etch can also be used in this embodiment, to remove the oxide layer after the implant. As an example, the additional oxide layer (not shown) can be formed by depositing and/or growing an approximately 75 nanometer thick layer of silicon dioxide over region 128 and layer 136, and in cavity 105. The oxide layer can be removed by performing a wet HF etch after doping regions 124 and 128 to form region 126. In another embodiment, instead of implanting after the formation of cavity 105, the implanting can be performed after the formation of spacer 142 and before the formation of cavity 105. In still another embodiment, this implantation to form region 126 can be omitted altogether. All these approaches are useful. Structure 305 results.

Figure 6:
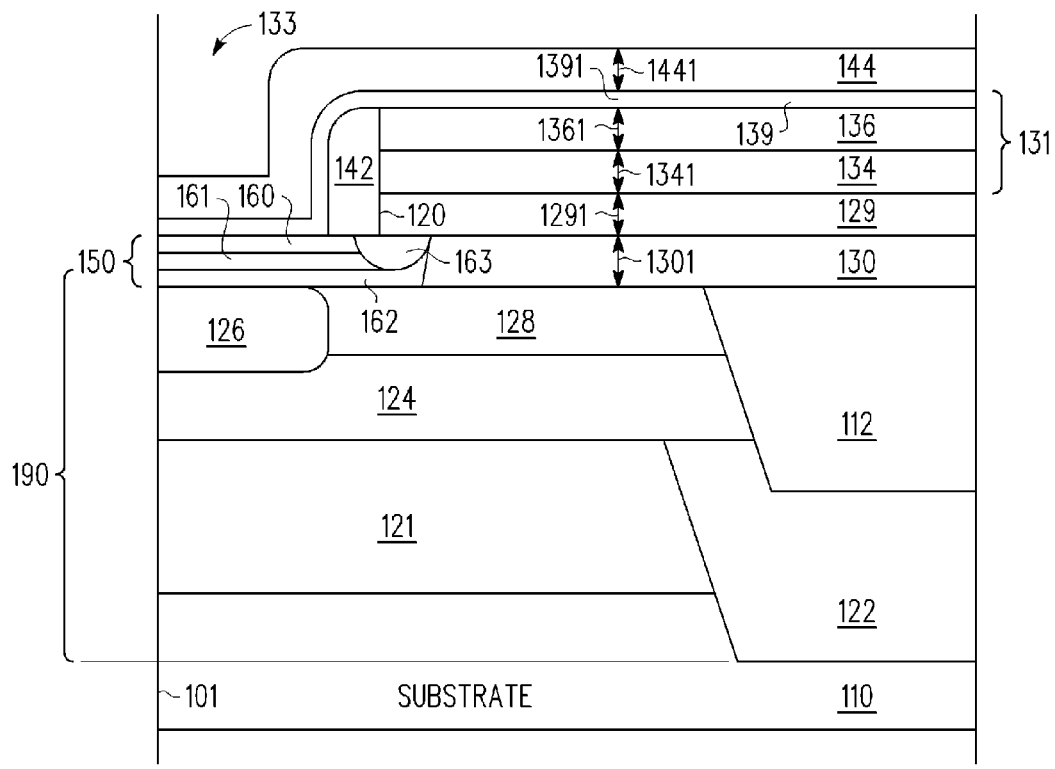

Referring now to manufacturing stage 206 of FIG. 6, epitaxial layer 150 is formed on regions 126 and 128. A portion of epi-layer 150 underlies spacer 142 and the left end of layer 129. Layer 150 couples together region 126 of collector region 190 and extrinsic base contact 129. In one embodiment, layer 150 is doped. As an example for an NPN device, a portion of layer 150 includes a boron dopant to form an intrinsic base region for an NPN device. In another embodiment, layer 150 can be a composite epitaxial layer. As a non-limiting example, layer 150 can formed by the process of: (a) growing a silicon epitaxial layer 162 over regions 126 and 128; (b) growing a SiGeC (silicon-germanium-carbon) epitaxial layer 161 over layer 162; and (c) growing a silicon epitaxial layer 160 over layer 161. One or more of layers 160, 161, and 162 can be doped to form the intrinsic base region of transistor 100. The exact nature and manner of formation of epi-region 150 is not important to the embodiments of the present invention provided that some portion thereof forms the intrinsic base region of transistor 100, 100'. For convenience of explanation it is assumed hereafter that epi-region 150 comprises n-type region 162 in contact with n-type region 126 of collector region 190, p-type intrinsic base region 161, and n-type emitter region 160 in a stack-like arrangement. Region 160 may be n-doped during formation or afterward by out diffusion from the heavily doped emitter contact layer 153 of FIG. 8. In other embodiments, layer 150 can be a composite epitaxial layer formed by a combination of silicon, silicon germanium (SiGe), SiGeC, or other epitaxial semiconductor materials.

Semiconductor region 163 of enhanced doping in contact with the left end of layer 129 is desirably formed during the formation of layer 150. In one embodiment, region 163 is a non-crystalline epitaxial region formed during the formation of layer 150 and doped by out-diffusion from polycrystalline layer 129. In another embodiment, region 163 is a portion of region 150, which is doped by diffusion from layer 129 and/or during formation of layer 150. The combination of one or more of layers or regions 162, 128, 126, 124, 121, and 122 are referred to as collector region 190 of bipolar transistor 100, 100'. Depending on the desired electrical characteristics of the transistor, any combination of one or more of these layers may be utilized with embodiments of the present invention. For example, layer 162 may be omitted from collector region 190, or layer 126 and/or layer 124 may be omitted from collector region 190. All such variations are useful.

Dielectric layer 139 is desirably formed over spacer 142 and layers 136 and 150. As an example, layer 139 of thickness 1391 can be formed by depositing an oxide formed using TEOS. Thickness 1391 is usefully in the range of about 5 to 60 nanometers, more conveniently about 10 to 40 nanometers and preferably about 30 nanometers, but thicker or thinner layers can also be used depending upon the desired device properties. Spacer layer 144 of thickness 1441 is desirably deposited over layer 139. In one embodiment, amorphous silicon (a-Si) is deposited to form layer 144. In another embodiment, the a-Si layer is implanted with one or more N+ dopants. In a further embodiment, the a-Si layer is doped in-situ. In yet another embodiment, layer 144 is formed by deposition of silicon nitride instead of a-Si. In another embodiment, layer 144 can be an oxide-nitride stack. All such variations are useful. Structure 306 results.

Figure 7:
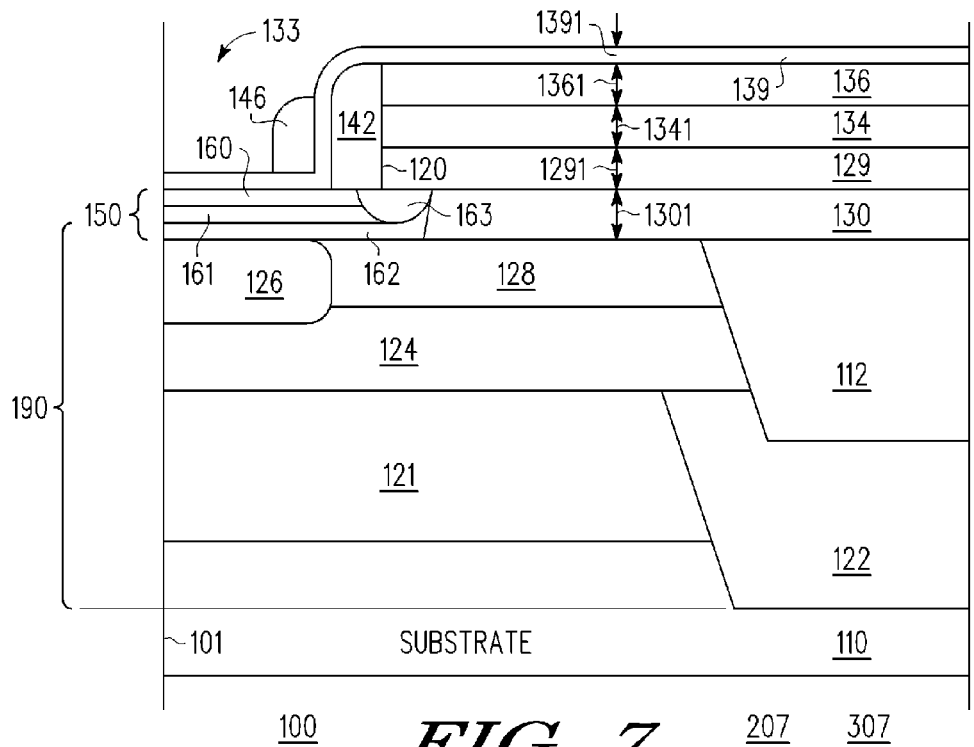
Figure 8:
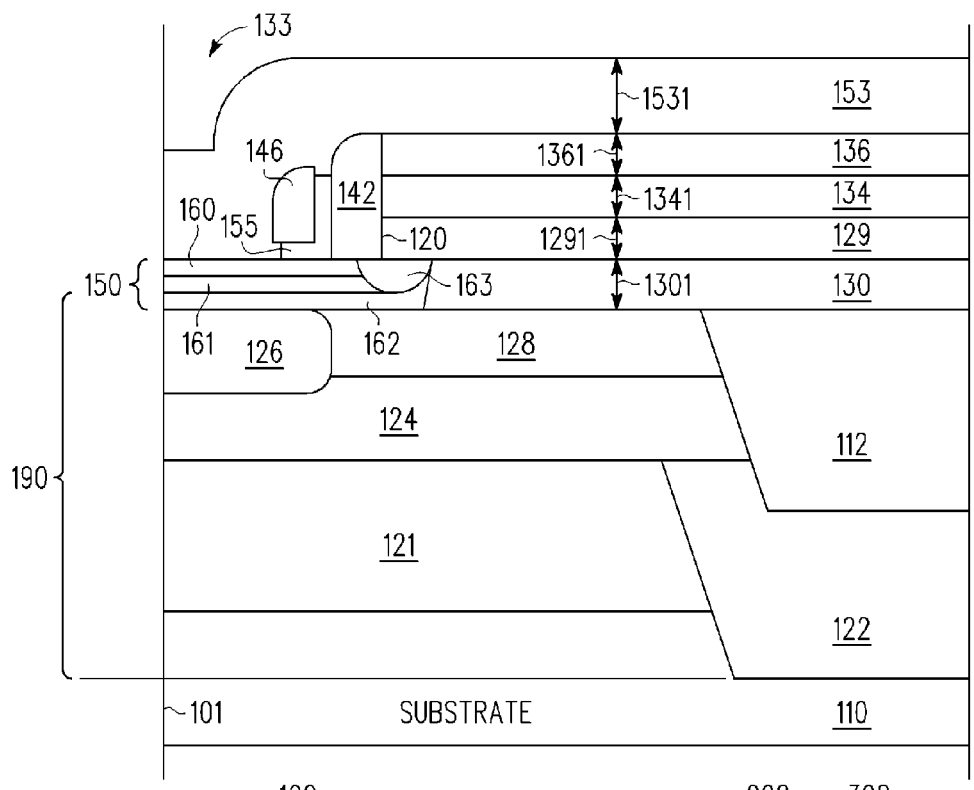

Referring now to manufacturing stage 207 of FIG. 7, part of layer 144 of FIG. 6 is desirable removed to form spacer 146. In one embodiment, layer 144 is anisotropically etched, using layer 139 as an etch stop, to form spacer 146. As an example, layer 144 can be etched using a RIE process to form spacer 146. There are many variations of spacer shapes that may be formed here, depending on the composition of layers 144 and 139. All such variations are useful. Structure 307 results. Referring now to manufacturing stage 208 of FIG. 8, spacer 155 is formed by removing part of (e.g., oxide) layer 139 of FIG. 7. In one embodiment, layer 139 is wet-etched to form spacer 155 using spacer 146 as a hard mask and spacer 142 and layers 136 and 150 as etch stop regions or layers. In another embodiment, spacer 155 is formed by anisotropically etching part of layer 139 before wet etching the rest of layer 139. Emitter electrode layer 153 of thickness 1531 is formed over layers 136 and 150, and spacers 142, 146, and 155. Thickness 1531 is usefully in the range of about 20 to 200 nanometers, more conveniently about 60 to 120 nanometers and preferably about 100 nanometers, but thicker or thinner layers can also be used depending upon the desired device properties. In one embodiment, emitter electrode layer 153 is formed by depositing an in-situ doped polysilicon layer that will be subsequently patterned and etched in manufacturing stage 209 of FIG. 9 to form emitter contact 154 (see FIG. 9). A hydrogen pre-bake is desirably performed for mono-emitters to eliminate any interfacial oxide layer between layer 153 (and emitter contact 154 of FIG. 9) and layer 150, which will also promote epitaxial alignment of emitter contact 154. In another embodiment, a polysilicon emitter electrode layer 153 can be deposited and then doped with ion implantation. Either arrangement is useful. The n-type dopants from the in-situ doping or implantation of emitter polysilicon emitter contact 154 of FIG. 9 will diffuse into layer 160, to form an emitter region. Structure 308 results.

Referring now to manufacturing stage 209 of FIG. 9, emitter electrode layer 153 is patterned to form emitter contact 154 ohmically coupled to epitaxial region 150 and separated by spacers 146, 142 and 155 from the extrinsic base contact provided by conductive layer 129 also referred to as extrinsic base contact 129. In general, distance 1541 by which emitter contact 154 extends to the right beyond left edge 120 of extrinsic base contact 129 should be equal or larger than the minimum alignment accuracy of the manufacturing process being used. Dielectric regions 136' and 134' remaining from layers 136 and 134 vertically separate overlapping emitter contact portion 154' from extrinsic base contact 129. Structure 309 results.

FIG. 10 show simplified schematic cross-sectional views of a portion of semiconductor device 100' following from manufacturing stages 201-209 of FIGS. 1-9, illustrating how higher than desired extrinsic base resistance can arise. In manufacturing stage 210 of FIG. 10, emitter contact 154 and extrinsic base contact 129 of doped semiconductor are exposed to a highly conductive metal(s) or equivalent to form, for example, metal-semiconductor alloy layers (e.g., silicide) 170, 172 to reduce their resistance. The silicide is much more conductive than what can be achieved merely by doping contacts 154, 129. Use of a metal-semiconductor alloy (e.g., a silicide) significantly reduces the resistance of emitter contact 154 and extrinsic base contract 129. As used herein in connection with metal-semiconductor alloys including but not limited to silicides, the term "metal" is intended to include any conductor that forms an alloy with a semiconductor that is significantly more conductive than what can be achieved merely by substitutionally doping the semiconductor with impurity atoms. However, even though such conductive metal-semiconductor alloys are employed in layers 170, 172 of FIG. 10, undesirable extrinsic base resistance 180 (see FIG. 10) can still exist where base current must flow through non-silicide or non-alloyed portion 1292 of layer 129 between left end 1721 of silicide or alloy region 172 and doped region 163 in contact with intrinsic base 161 of transistor 100'.

Figure 11:
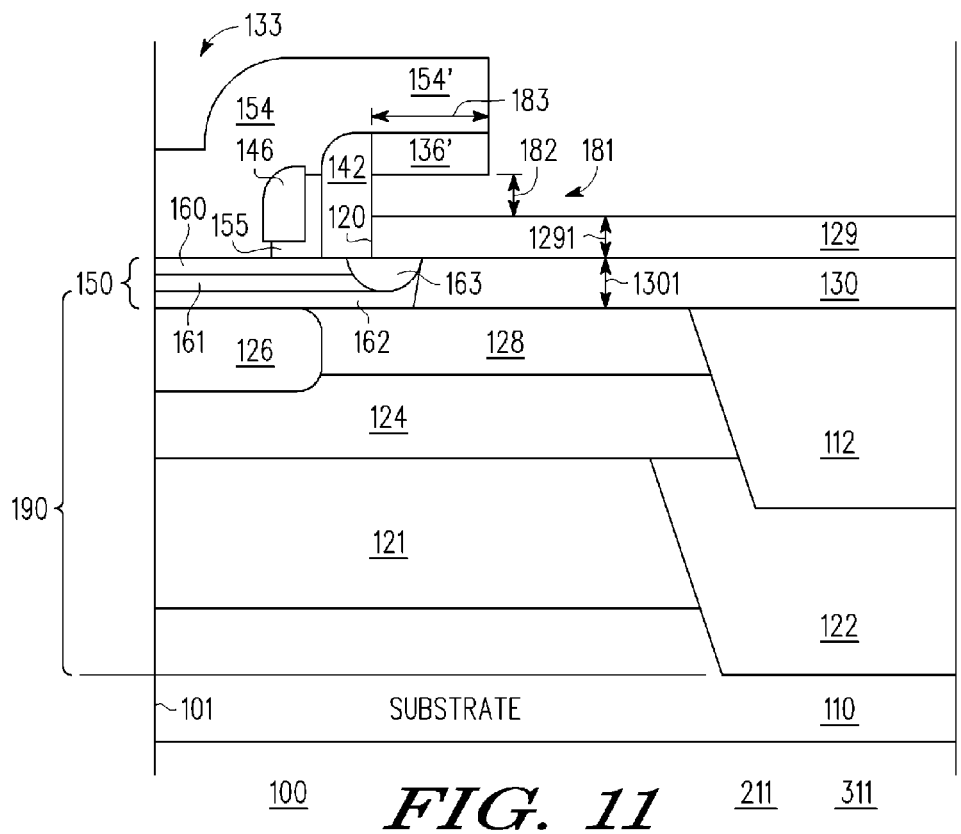
Figure 12:
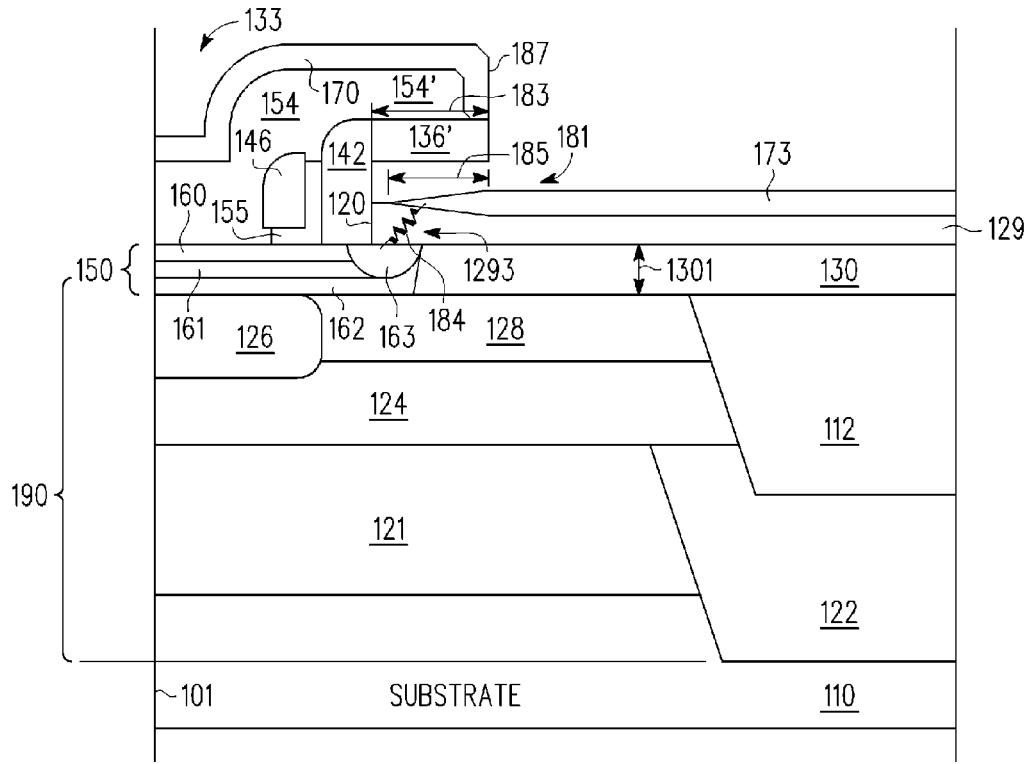

Manufacturing stage 211 of FIG. 11 follows from manufacturing stage 209 of FIG. 9. In manufacturing stage 211 of FIG. 11, portion 134' of manufacturing stage 209 (see FIG. 9) is etched away from underneath overhanging portion 154' of emitter contact 154, thereby providing cavity 181 of lateral width 183 and vertical height 182. Selective etching can be used since, for example, portion 134' (see FIG. 9) is of oxide, while adjacent portions 136', 142 are of nitride and adjacent portions 129, 154 are of poly-silicon, neither of which is significantly attacked by reagents that can be used to remove oxide portion 134'. This greatly facilitates manufacturing stage 211. Structure 311 results. In manufacturing stage 212 of FIG. 12, emitter contact 154 and extrinsic base contact 129 are, for example, silicided as discussed in connection with FIG. 10. However, the presence of cavity 181 permits the atoms used to form the silicide to migrate and penetrate laterally by distance 185 within cavity 181 toward left edge 120 of extrinsic base contact 129, thereby forming extrinsic base silicide contact 173 that extends beneath overhanging portion 154' of emitter contact 154, so that resistance 184 in region 1293 between the left end of extrinsic base contact 129, 173 and doped base contact region 163 is much less than resistance 180 of region 1292 of FIG. 10. Thus, the extrinsic base resistance is reduced and the overall performance of device 100 of FIG. 12 is improved compared to device 100' of FIG. 10. Where emitter contact 154 and extrinsic base contact 129 comprise silicon, then $CoSi_2$ and $NiSi_2$, PtSi and/or NiPtSi are non-limiting examples of suitable silicides for layers 170, 172, 173. When for example and not intended to be limiting, poly-silicon contacts 154, 129 are exposed to atoms or molecules of cobalt or Ni or Pt and/or NiPt, the silicon and cobalt, nickel or platinum or combinations thereof react in place to convert portions 170, 172, 173 of contacts 154, 129 to highly conductive silicides. Sputtering is a preferred method for depositing Co, Ni, Pt, NiPt, etc., to form silicides, but other well known deposition techniques can also be used, for example and not intended to be limiting, chemical vapor deposition (CVD). For example and not intended to be limiting, 1 to 50 nanometers of cobalt (Co), more conveniently about 4 to 30 nanometers of Co and preferably about 8 to 15 nanometers of Co are sputtered onto polysilicon contacts 154', 129, 129' of FIGS. 11-14. The other metals noted above may also be used. The sputtering usefully occurs at substrate wafer temperatures of about 20 to 300 degrees Celsius, more conveniently about 100 to 200 degrees Celsius and preferably at or above about 150 degrees Celsius. Sputtering is conveniently carried out in argon at a pressure of about 7 milli-Torr but higher and lower pressures and other inert gases can also be used. In some embodiments, the Co may be capped with a titanium nitride (TiN) layer having usefully about 1 to 50 nanometers of TiN, more conveniently about 4 to 30 nanometers of TiN and preferably about 15 nanometers of TiN. This is desirable to improve thermal stability and reduce sensitivity to contaminants in some embodiments. The sputtered metal layers are reacted with the underlying polysilicon of contacts 154', 129, 129' by usefully annealing at about 350 to 850 degrees Celsius for about 5 to 120 seconds in nitrogen or other substantially inert gas, more conveniently at 400 to 500 degrees Celsius for about 20 to 60 seconds and preferable at about 450 degrees Celsius for about 30 seconds. Other atmospheres or vacuum may also be used. A brief wet etch is then desirably performed to remove any un-reacted Co or other alloying metal (and the TiN cap layer if present) and a further anneal performed at about 350 to 900 degrees Celsius for about 5 to 120 seconds usefully provided, more conveniently at about 750 to 850 degrees Celsius for about 30 to 90 seconds and preferably at about 800 degrees Celsius for about 60 seconds. The cobalt or other alloying metal reacts with the poly-silicon in emitter contact 154' and extrinsic base contact 129, 129' to form silicide layers 170, 172 (see FIG. 10), 173 (see FIGS. 12), and 173" (see FIG. 14).

Figure 13:
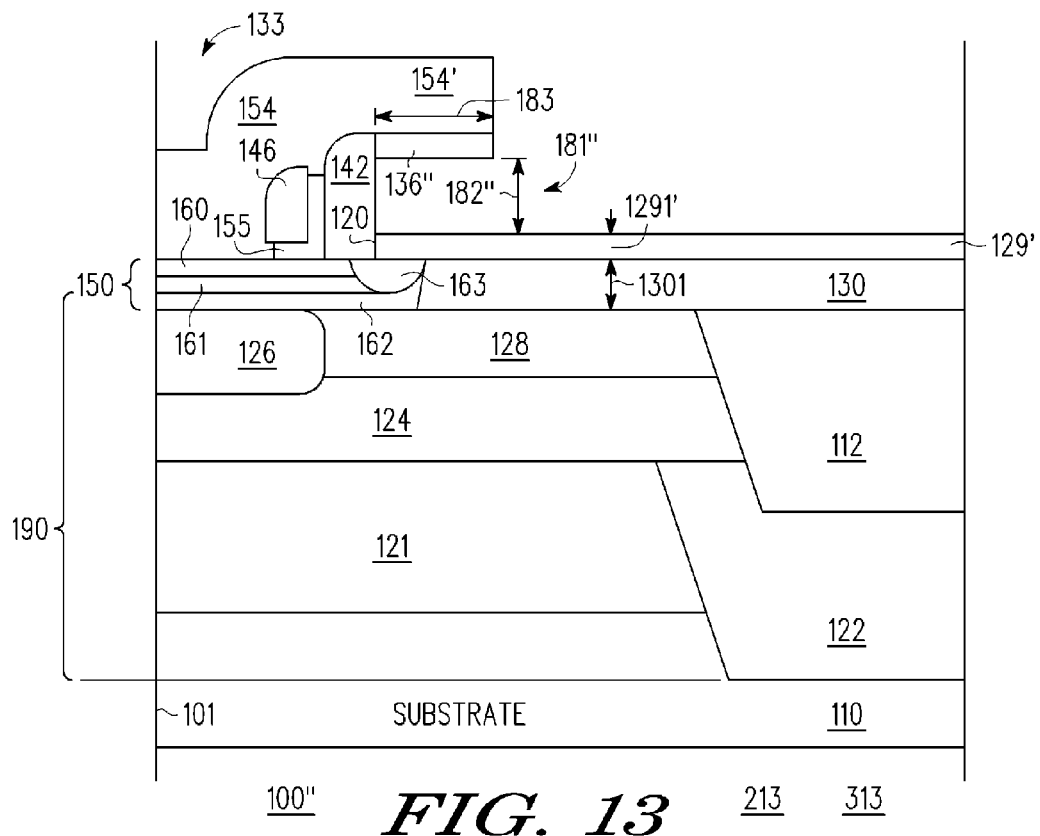
FIGS. 13-14 show simplified schematic cross-sectional views, analogous to those of FIGS. 11-12, of a portion of a semiconductor device at various stages of manufacture according to a further embodiment of the present invention.
Figure 14:
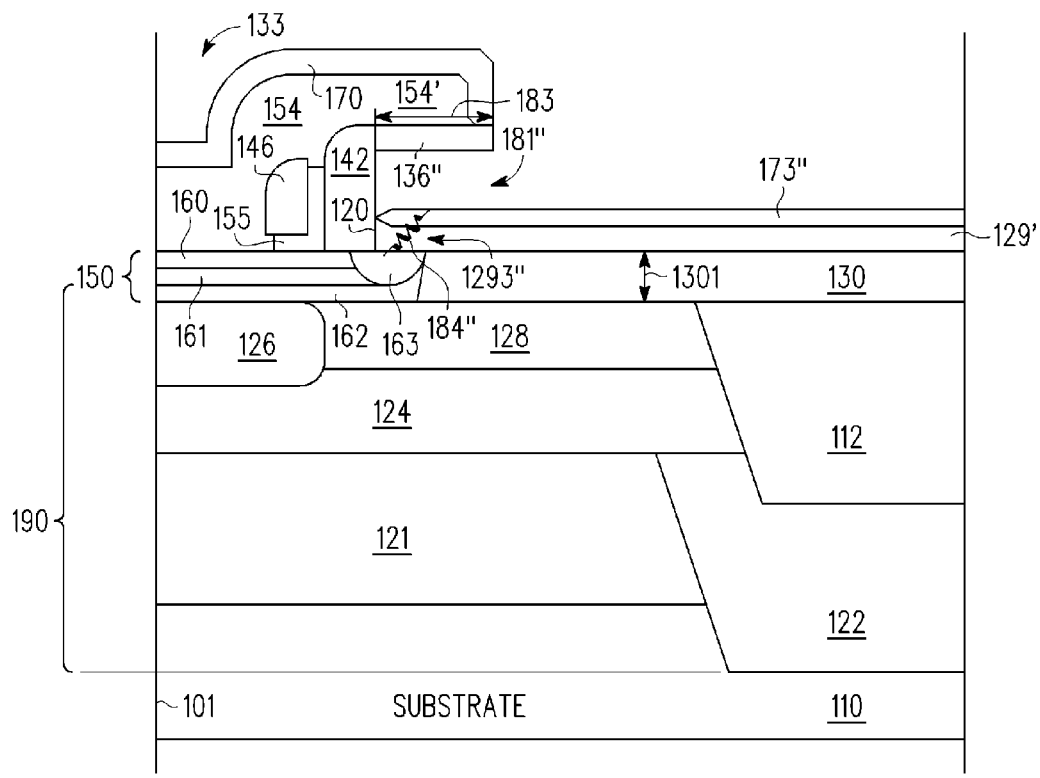

FIGS. 13-14 show simplified schematic cross-sectional views, analogous to those of FIGS. 11-12, of a portion of semiconductor device 100" at various stages of manufacture according to a further embodiment of the present invention. Manufacturing stage 213 of FIG. 13 is analogous to manufacturing stage 211 of FIG. 11 and manufacturing stage 214 of FIG. 14 is analogous to manufacturing stage 212 of FIG. 12, the discussion of which is incorporated herein by reference. FIGS. 13-14 follow from manufacturing stages 201-209 of FIGS. 1-9. Device 100" of FIGS. 13-14 differs from device 100 of FIGS. 11-12 in that during manufacturing stage 202 of FIG. 2, layer 134 (e.g., oxide) of thickness 1341 is made relatively thicker and layer 129 (e.g. of poly) of thickness 1291 is made relatively thinner. Layer 136 (e.g., of nitride) may also be made thinner or left the same as in device 100. In a preferred embodiment, the thickness of layer 136 is left unchanged. In the embodiments of FIGS. 1-9 and 13-14 leading to device 100", thickness 1341 of layer 134 is usefully in the range of about 50 to 150 nanometers, more conveniently about 60 to 120 nanometers and preferably about 95 nanometers, and thickness 1291 is usefully in the range of about 10 to 100 nanometers, more conveniently about 20 to 60 nanometers and preferable about 50 nanometers. In manufacturing stage 213 of FIG. 13, region 134' (e.g., oxide) of FIG. 9 is removed, leaving behind portion 136" of layer 136. Resulting cavity 181" has larger height 182" relative to depth 183. Structure 313 results. The aspect ratio (height/depth) of cavity 181" is increased, thereby facilitating the migration of alloying metal atoms into cavity 181" during manufacturing stage 214 wherein silicide contact 173" is formed, thereby permitting silicide contact 173" to extend more robustly into cavity 181". This further reduces resistance 184" in region 1293". This is desirable. Structure 314 results. In another embodiment, portion 136" may be partially etched before (preferred) or after removal of region 134'. Selective etching can be used since, for example, portion 136' (see FIG. 9) is of nitride, while adjacent portions 134' is of oxide and adjacent portions 129, 154 are of poly-silicon, neither of which is attacked by the reagents that can be used to partially remove nitride portion 136', although care should be taken not to completely erode lateral spacer 142. This can further increase the aspect ratio of cavity 181". In general, the larger the cavity aspect ratio (AR)=cavity height/cavity depth, the easier it is for metal forming silicide (or other semiconductor-metal alloy) 173, 173" to penetrate closer to edge 120 of extrinsic base contact 129. The further into cavity 181, 181" that silicide (or other semiconductor-metal alloy) 173, 173" extends, the lower extrinsic base resistance 184". It is desirable that the cavity aspect ratio (AR), defined as the cavity height (182, 182") divided by the cavity depth (183) expressed as a percent, is usefully at least 50%, more conveniently at least 75% and preferably at least 100%. Stated another way, it is useful for the height 182, 182" of cavity 181, 181" to be at least 50 percent of cavity depth 183, more conveniently at least 75 percent of cavity depth 183 and preferably at least 100 percent of cavity depth 183.

Figure 15:
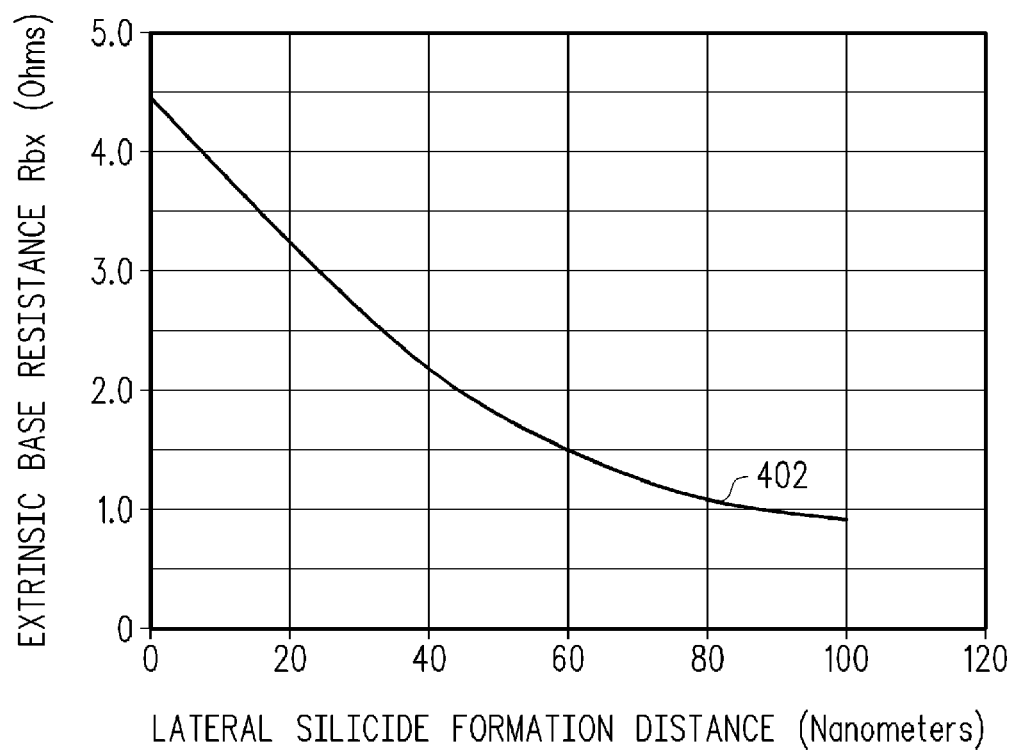
FIG. 15 shows a plot of extrinsic base resistance Rbx in ohms versus the lateral silicide formation distance obtained by computer simulation for the device of FIGS. 12 and 14.

FIG. 15 with trace 402 shows plot 400 (obtained by computer simulation) of extrinsic base resistance Rbx in ohms as a function of lateral silicide formation distance 185 (e.g., see FIG. 12) in nanometers within cavity 181. In this instance, lateral distance 183 between left edge 120 of extrinsic base contact 129 and edge 187 (see FIG. 14) of emitter contact overhang region 154' was assumed to be about 100 nanometers. The 50-75% reduction in Rbx illustrated in FIG. 15 provides a substantial reduction in total base resistance Rb for typical device geometry, and is expected to provide a 20-30% increase in $f_{MAX}$. This is highly desirable.

Figure 16:
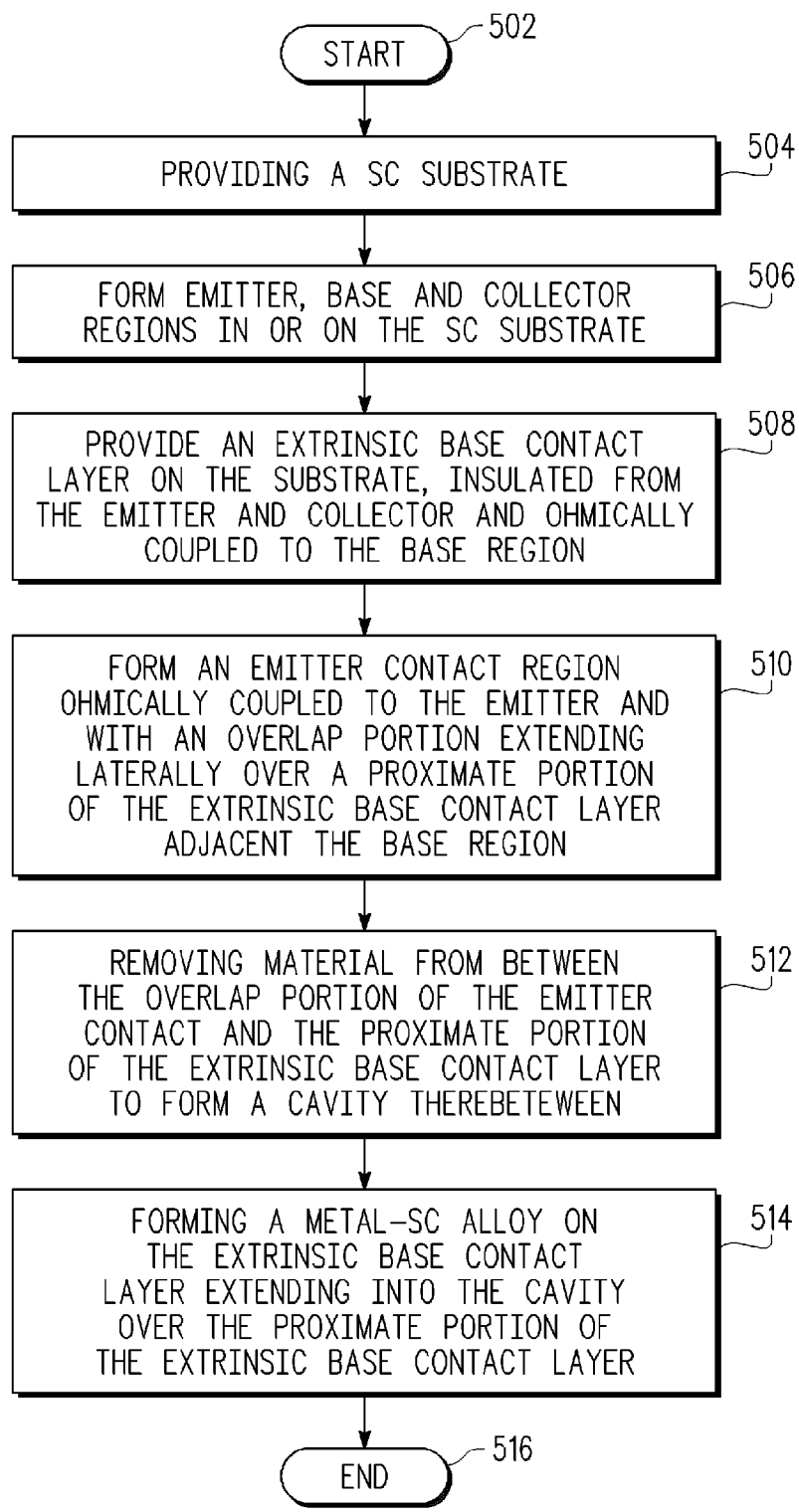
FIG. 16 illustrates a flow chart for a method of manufacturing a semiconductor device having reduced extrinsic base resistance, according to still further embodiments of the present invention.

FIG. 16 illustrates a flow chart for method 500 of manufacturing a semiconductor device (100, 100") having reduced extrinsic base resistance. Method 500 begins with START 502 and initial step 504 wherein semiconductor (abbreviated as "SC") substrate 110 is provided, as for example is illustrated in FIG. 1. In subsequent step 506, emitter 160, base 161 and collector 190 regions are formed in or on the substrate 110. As is illustrated for example in FIGS. 2-6. In step 508, extrinsic base contact layer 129 is provided on substrate 110, insulated from emitter region 160 and collector region 190 and ohmically coupled to (intrinsic) base region 161, as is illustrated for example, in FIGS. 2-6). In step 510, an emitter contact region 154 is formed, ohmically coupled to emitter region 160 and with overlap portion 154' extending laterally over proximate portion 1293, 1293" of extrinsic base contact layer 129 to form cavity 181, 181" therebetween, as is illustrated for example in FIGS. 7-9, 11, 13. In step 514, a metal-SC alloy is formed on extrinsic base contact layer 129 extending into cavity 181, 181" over proximate portion 1293, 1293" of extrinsic base contact layer 129, as is illustrated for example in FIGS. 12, 14. Method 500 then proceeds to END 516.

According to a first embodiment, there is provided a method (500) for forming a semiconductor device (100, 100"), comprising, providing (201, 504) a semiconductor substrate (110), forming (202-206, 506) emitter (160), base (161) and collector (190) regions in or on the substrate (110), providing (202-206, 508) an extrinsic base contact region (129) ohmically coupled to the base region (161), forming (208-209; 211-214, 510) an emitter contact region (154) ohmically coupled to the emitter region (160), wherein a portion (154') of the emitter contact region (154) overhangs a portion (1293, 1293") of the extrinsic base contact region (129,129'), forming (512) a cavity (181, 181") of predetermined lateral depth (183) and vertical height (182, 182") between the overhanging portion (154') of the emitter contact region (154) and the underlying portion (1293, 1293") of the extrinsic base contact region (129), and exposing (212, 214, 514) the emitter contact region (154) and the extrinsic base contact region (129) to metal atoms so as to form a first conductive semiconductor-metal alloy (170) on an upper surface of the emitter contact region (154), and a second conductive semiconductor-metal alloy (173, 173") on an upper surface of the extrinsic base contact region (129) wherein the second conductive semiconductor-metal alloy (173. 173") extends into the cavity (181, 181") under the overhanging portion (154') of the emitter contact region (154). According to a further embodiment, the vertical height (182, 182") of the cavity (181, 181") is at least 50 percent of the lateral depth (183) of the cavity (181, 181"). According to a still further embodiment, the vertical height (182, 182") of the cavity (181, 181") is at least 75 percent of the lateral depth (183) of the cavity (181, 181"). According to a still further embodiment, the vertical height (182, 182") of the cavity (181, 181") is at least 100 percent of the lateral depth (183) of the cavity (181, 181"). According to a yet further embodiment, the substrate (110) comprises silicon and the semiconductor-metal alloy comprises a silicide. According to a still yet further embodiment, the silicide comprises cobalt silicide or nickel silicide or platinum silicide or a combination thereof. According to a yet still further embodiment, the step of forming emitter (160), base (161) and collector (190) regions comprises forming a hetero junction emitter-base region (150). According to another embodiment, the hetero junction emitter-base region (150) comprises silicon and germanium. According to a still another embodiment, the hetero junction emitter-base region (150) comprises silicon, germanium and carbon. According to a yet another embodiment, the step of exposing (212, 214, 514) the emitter contact region (154) and the extrinsic base contact region (129) to metal atoms occurs at or above about 100 degrees Celsius. According to a still yet another embodiment, the step of exposing the emitter contact region (154) and the extrinsic base contact region (129) to metal atoms further comprises, annealing at about 350 to 850 degrees Celsius for at least 5 seconds in a substantially inert gas, and then etching to remove any un-reacted metal atoms, and then further annealing at about 350 to 900 degrees Celsius go at least 5 seconds. According to a yet still another embodiment, the further heating occurs for at least 30 seconds.

According to a second embodiment, there is provided a semiconductor device (100, 100"), comprising, emitter (160), base (161) and collector (190) regions, an extrinsic base contact (129), ohmically coupled via a semiconductor transition region (163) to the base region (161), an emitter contact region (154) having a portion (154') overhanging an underlying portion (1293, 1293") of the extrinsic based contact (129), thereby forming a cavity (181, 181") between the overhanging portion (154') and the underlying portion (1293, 1293"), and a metal-semiconductor alloy (173, 173") formed on the extrinsic base contact (129) extending within the cavity (181, 181") toward the transition region (163). According to a further embodiment, the metal-semiconductor alloy (173, 173") extends into the cavity (181, 181") so as to at least partially overlie the transition region (163). According to a still further embodiment, the metal-semiconductor alloy (173, 173") comprises a semiconductor reacted with one or more of Co, Ni, Pt, NiPt and combinations thereof. According to a yet further embodiment, the metal for forming the metal-semiconductor alloy is deposited at a temperature equal or greater than about 100 degrees Celsius. According to a still yet further embodiment, the metal-semiconductor alloy is annealed after deposition at a temperature exceeding the deposition temperature.

According to a third embodiment, there is provided a method (500) for forming a bipolar transistor, comprising, providing (504) a substrate (110) comprising a semiconductor, forming (506) emitter (160), base (161) and collector (190) regions in or on the substrate (110), providing (508) an extrinsic base contact (129), ohmically coupled to the base region (161), forming (510) an emitter contact region (154) having a portion (154') overhanging an underlying portion (1293, 1293") of the extrinsic base contact (129), thereby forming a cavity (181, 181") between the overhanging portion (154') and the underlying portion (1293, 1293"), and forming (512, 514) a metal-semiconductor alloy (173, 173") on the underlying portion (1293, 1293") of the extrinsic base contact region (129) extending within the cavity (181, 181"). According to a further embodiment, the cavity (181, 181") has a height (182, 182") substantially perpendicular to the substrate (110) and a depth (183) substantially parallel to the substrate (110) and wherein the height (182, 182") is at least 50 percent of the depth (183). According to a still further embodiment, the semiconductor is silicon and the metal-semiconductor alloy is a silicide.

Persons of skill in the art will understand that following manufacturing stages 212 of FIG. 12, 214 of FIGS. 14 and 508 of FIG. 16, that further conductive interconnections and protective encapsulants may be applied, that the substrate may be singulated into individual die or integrated circuits (and optionally mounted into a protective package) to provide a finished product, using means well known in the art. Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that regions or layers 129, 130, 134, 136, 138, 139, 144, 153, 170, 173, etc., may be comprised of many different material and formed by many different methods, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims. Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention embodiments in any way. Rather, the foregoing detailed description will provide those skilled in the art with a convenient road map for implementing an exemplary embodiment of the invention, it being understood that various changes may be made in the function and arrangement of elements described and methods of preparation in an exemplary embodiment without departing from the scope of the invention as set forth in the appended claims and their legal equivalents.

What is claimed is:

1. A semiconductor device, comprising:
    emitter, base and collector regions;
    an extrinsic base contact, ohmically coupled via a semiconductor transition region to the base region;
    an emitter contact region having a portion overhanging an underlying portion of the extrinsic based contact, thereby forming a cavity between the overhanging portion and the underlying portion; and
    a metal-semiconductor alloy formed on the extrinsic base contact extending within the cavity toward the transition region.

2. The device of claim 1, wherein the metal-semiconductor alloy extends into the cavity so as to at least partially overlie the transition region.

3. The device of claim 2, wherein the metal-semiconductor alloy comprises a semiconductor reacted with one or more of Co, Ni, Pt, NiPt and combinations thereof.

4. The device of claim 3, wherein the metal for forming the metal-semiconductor alloy is deposited at a temperature equal or greater than about 100 degrees Celsius.

5. The device of claim 4, wherein the metal-semiconductor alloy is annealed after deposition at a temperature exceeding the deposition temperature.

6. The device of claim 1, wherein a vertical height of the cavity is at least 50 percent of a lateral depth of the cavity.

7. The device of claim 6, wherein the vertical height of the cavity is at least 75 percent of the lateral depth of the cavity.

8. The device of claim 7, wherein the vertical height of the cavity is at least 100 percent of the lateral depth of the cavity.

9. A semiconductor device, comprising:
    a semiconductor substrate;
    emitter, base, and collector regions in or on the substrate;
    an extrinsic base contact region ohmically coupled to the base region;

an emitter contact region ohmically coupled to the emitter region, wherein a portion of the emitter contact region overhangs a portion of the extrinsic base contact region;

a cavity of predetermined lateral depth and vertical height between the overhanging portion of the emitter contact region and the underlying portion of the extrinsic base contact region;

a first conductive semiconductor-metal alloy on an upper surface of the emitter contact region; and a second conductive semiconductor-metal alloy on an upper surface of the extrinsic base contact region wherein the second conductive semiconductor-metal alloy extends into the cavity under the overhanging portion of the emitter contact region, and wherein the first conductive semiconductor-metal alloy and the second conductive semiconductor-metal alloy are formed from the emitter contact region and the extrinsic base contact region being exposed to metal atoms.

10. The device of claim 9, wherein the vertical height of the cavity is at least 50 percent of the lateral depth of the cavity.

11. The device of claim 10, wherein the vertical height of the cavity is at least 75 percent of the lateral depth of the cavity.

12. The device of claim 11, wherein the vertical height of the cavity is at least 100 percent of the lateral depth of the cavity.

13. The device of claim 9, wherein the substrate comprises silicon and the semiconductor-metal alloy comprises a silicide.

14. The device of claim 13, wherein the silicide comprises cobalt silicide or nickel silicide or platinum silicide or a combination thereof.

15. The device of claim 9, wherein the emitter, base, and collector regions comprise a hetero junction emitter-base region.

16. The device of claim 15, wherein the hetero junction emitter-base region comprises silicon and germanium.

17. The device of claim 16, wherein the hetero junction emitter-base region comprises silicon, germanium and carbon.

18. A bipolar transistor, comprising:

a substrate comprising a semiconductor;

emitter, base and collector regions in or on the substrate;

an extrinsic base contact, ohmically coupled to the base region;

an emitter contact region having a portion overhanging an underlying portion of the extrinsic base contact, thereby forming a cavity between the overhanging portion and the underlying portion; and a metal-semiconductor alloy on the underlying portion of the extrinsic base contact region extending within the cavity.

19. The bipolar transistor of claim 18, wherein the cavity has a height substantially perpendicular to the substrate and a depth substantially parallel to the substrate and wherein the height is at least 50 percent of the depth.

20. The bipolar transistor of claim 19, wherein the semiconductor is silicon and the metal-semiconductor alloy is a silicide.

* * * * *